United States Patent
Zhang (10) Patent No.: US 12,322,460 B2
(45) Date of Patent: Jun. 3, 2025

(54) ANTI-FUSE CIRCUIT AND ANTI-FUSE UNIT PROGRAMMING STATE REAL-TIME VERIFICATION

(71) Applicant: ChangXin Memory Technologies, Inc., Hefei (CN)

(72) Inventor: Jiarui Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/036,086

(22) PCT Filed: Oct. 19, 2022

(86) PCT No.: PCT/CN2022/126178
§ 371 (c)(1),
(2) Date: May 9, 2023

(87) PCT Pub. No.: WO2023/221391
PCT Pub. Date: Nov. 23, 2023

(65) Prior Publication Data
US 2024/0145018 A1 May 2, 2024

(30) Foreign Application Priority Data
May 19, 2022 (CN) .......................... 202210546451.X (51) Int. Cl.
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC .................. G11C 17/16; G11C 17/18
(Continued)

(56) References Cited

U.S. PATENT DOCUMENTS 6,150,868 A * 11/2000 Kim .................. G11C 17/18
365/96
6,240,033 B1 * 5/2001 Yang .................... G11C 29/781
365/96
(Continued)

FOREIGN PATENT DOCUMENTS

CN 101425341 B 2/2013
CN 110136768 A 8/2019

OTHER PUBLICATIONS

PCT/CN2022/126176 International Search Report mailed Feb. 14, 2023.

*Primary Examiner* — Muna A Techane
(74) *Attorney, Agent, or Firm* — Syncoda LLC; Feng Ma (57) ABSTRACT

The disclosed anti-fuse circuit includes: an anti-fuse unit; a programming circuit, configured to program the anti-fuse unit according to a programming signal; a verification unit, including a first input terminal, a second input terminal and a first output terminal, the programming signal of the anti-fuse unit is the input signal of the first input terminal, and the data signal stored in the anti-fuse unit is the input signal of the second input terminal. The verification unit verifies the programming state of the anti-fuse unit according to the input signals of the first input terminal and the second input terminal, and the first output terminal outputs a verification signal. The anti-fuse circuit does not need to read out the data signal of the anti-fuse unit to a test machine followed by verifying the programming state of the anti-fuse unit. This anti-fuse circuit saves time and enables high verification accuracy.

16 Claims, 5 Drawing Sheets (58) Field of Classification Search
USPC .......................................................... 365/96
See application file for complete search history.

(56) References Cited

U.S. PATENT DOCUMENTS

| | | | | |
|---|---|---|---|---|
| 6,788,587 B2* | 9/2004 | Van De Graaff | ...... | G11C 17/16 |
| | | | | 365/225.7 |
| 2019/0325977 A1* | 10/2019 | Hoang | ................... | H10D 62/10 |

* cited by examiner

| Data | Programming state of the anti-fuse unit | EFDAT | VerifyOut | Verification Result |
|---|---|---|---|---|
| 1 | not broken down | 1 | 1 | programming is correct |
| 1 | broken down | 0 | 0 | programming is incorrect |
| 0 | not broken down | 1 | 0 | programming is incorrect |
| 0 | broken down | 0 | 1 | programming is correct |

FIG. 5

ANTI-FUSE CIRCUIT AND ANTI-FUSE UNIT PROGRAMMING STATE REAL-TIME VERIFICATION

CROSS REFERENCES TO RELATED APPLICATIONS

This application claims the priority of the Chinese patent application No. 202210546451.X submitted on May 19, 2022 and entitled "Anti-fuse Circuit and Anti-fuse Unit Programming State Real-time Verification Method", the contents of which are incorporated herein by reference in its entirety.

TECHNICAL FIELD

The invention relates to the field of integrated circuits, in particular to an anti-fuse circuit and a method for real-time verification of the programming state of an anti-fuse unit.

BACKGROUND

In the semiconductor industry, fuse elements are widely used in integrated circuits due to their multiple applications. For example, multiple circuit modules with the same function are designed in the integrated circuit as a backup. When one of the circuit modules is found to be invalid, the circuit modules and other functional circuits in the integrated circuit are burned through the fuse element, and another circuit module with the same function replaces the failed circuit module.

With the continuous development of semiconductor technology, anti-fuse technology has attracted the attention of many inventors and manufacturers. Anti-fuse elements store information by changing from an insulating state to a conducting state. Writing information to the anti-fuse element is performed by dielectric breakdown caused by application of high voltage. The anti-fuse memory cell has a capacitive characteristic before programming, and no conduction channel is formed; when a programming breakdown occurs, a conduction channel will be formed at both ends of the cell, through which current can pass, and the magnitude of the conduction current is related to the programming effect.

However, the existing anti-fuse circuit cannot realize the real-time verification of the anti-fuse unit, thus cannot meet the demand.

SUMMARY

The technical problem to be solved by the embodiments of the present disclosure is to provide a real-time verification method for the programming status of the anti-fuse circuit and the anti-fuse unit, which can verify the programming status of the anti-fuse unit in real time.

In order to solve the above problems, an embodiment of the present disclosure provides an anti-fuse circuit, which includes: an anti-fuse unit; a programming circuit for programming the anti-fuse unit according to a programming signal; a verification unit, which includes a first input terminal, a second input terminal and a first output terminal, the programming signal of the anti-fuse unit is used as the input signal of the first input terminal, and the data signal stored in the anti-fuse unit is used as the first input signal. The verification unit can verify the programming state of the anti-fuse according to the input signals of the first input port and the second input port, and the first output port is used to output verification signals.

In one embodiment, the verification unit includes a logic gate circuit, and the logic gate circuit is used to perform an OR logic operation or an NOR logic operation on the programming signal and the data signal, and output the operation result as the verify signal.

In one embodiment, the logic gate circuit includes: a first transistor, the first terminal of the first transistor is electrically connected to the second input terminal, and the second terminal of the first transistor is electrically connected to the first node. connected, the gate of the first transistor is electrically connected to the first input terminal; for the second transistor, the first terminal of the second transistor is electrically connected to the first input terminal, and the first terminal of the second transistor is electrically connected to the first input terminal. The two terminals are electrically connected to the first node, the gate of the second transistor is electrically connected to the second input terminal, and the first node is electrically connected to the first output terminal; the charging unit, the charging A unit for providing a logic state value of WEAK 1 to said first output.

In an embodiment, the first transistor and the second transistor are transistors of the same type.

In an embodiment, both the first transistor and the second transistor are NMOS transistors or PNOS transistors.

In one embodiment, the charging unit includes a third transistor and the third transistor is a PMOS transistor, the gate of the third transistor is grounded, the first terminal of the third transistor is connected to a power supply voltage, and the third transistor is connected to a power supply voltage. The second terminals of the three transistors are connected to the first output terminal.

In an embodiment, the logic gate circuit further includes a switch unit connected between the first node and the first output terminal, and the switch unit is configured to be turned on or off in response to a verification enable signal.

In an embodiment, the switch unit includes a fourth transistor, the first terminal of the fourth transistor is electrically connected to the first node, and the second terminal of the fourth transistor is electrically connected to the first output terminal. connected, and the gate of the fourth transistor receives the verification enable signal.

In an embodiment, the fourth transistor is an NMOS transistor.

In an embodiment, a reading unit is further included, and the reading unit is used for reading the data signal of the anti-fuse unit.

In an embodiment, a read switch unit is further included, and the read switch unit is used to control the electrical connection between the anti-fuse unit and the read unit according to a read enable signal.

In one embodiment, the anti-fuse unit includes a first terminal and a second terminal, the first terminal of the anti-fuse unit is grounded, and the second terminal of the anti-fuse unit is connected to the read switch unit through the read switch unit. The input of the reading unit and the second input of the verifying unit are connected to a second node.

In an embodiment, the read unit includes: a pre-charge unit, configured to pre-charge the second node according to a pre-charge control signal; a latch, the input terminal of the latch is connected to the second node. The two nodes are electrically connected, and the output terminal of the latch is used as the output terminal of the reading unit.

In an embodiment, the pre-charging unit includes a fifth transistor, the first terminal of the fifth transistor is electrically connected to the power supply voltage, and the second terminal of the fifth transistor is electrically connected to the second node, so the gate of the fifth transistor receives the pre-charge control signal.

An embodiment of the present disclosure also provides a real-time verification method for the programming state of an anti-fuse unit, using the above-mentioned anti-fuse circuit, the method includes: inputting a programming signal, and performing a test on the anti-fuse unit according to the programming signal Perform programming; read the data signal stored in the anti-fuse unit; verify whether the anti-fuse unit is programmed correctly according to the data signal and the programming signal.

In one embodiment, verifying whether the anti-fuse unit is correctly programmed according to the data signal and the programming signal includes: if the programming signal of the anti-fuse unit is consistent with the data of the anti-fuse unit If the signals are consistent, the programming of the anti-fuse unit is correct. If the programming signal of the anti-fuse unit is inconsistent with the data signal of the anti-fuse unit, the programming of the anti-fuse unit is wrong.

In the anti-fuse circuit according to the embodiments of the present disclosure, when the anti-fuse unit completes breakdown programming and enters the verification mode, the verification unit can use the programming signal input from the first input terminal and the second input terminal. The input data signal of the anti-fuse unit verifies the programming state of the anti-fuse unit in real time, so that it is not necessary to read the data signal of the anti-fuse unit to the test machine and then verify the programming status of the anti-fuse unit, save time and have high verification accuracy.

DETAILED DESCRIPTION OF THE PREFERRED EMBODIMENTS

The specific implementation of the anti-fuse circuit and the real-time verification method for the programming state of the anti-fuse unit according to the present invention will be described in detail below in conjunction with the accompanying drawings.

Figure 1:
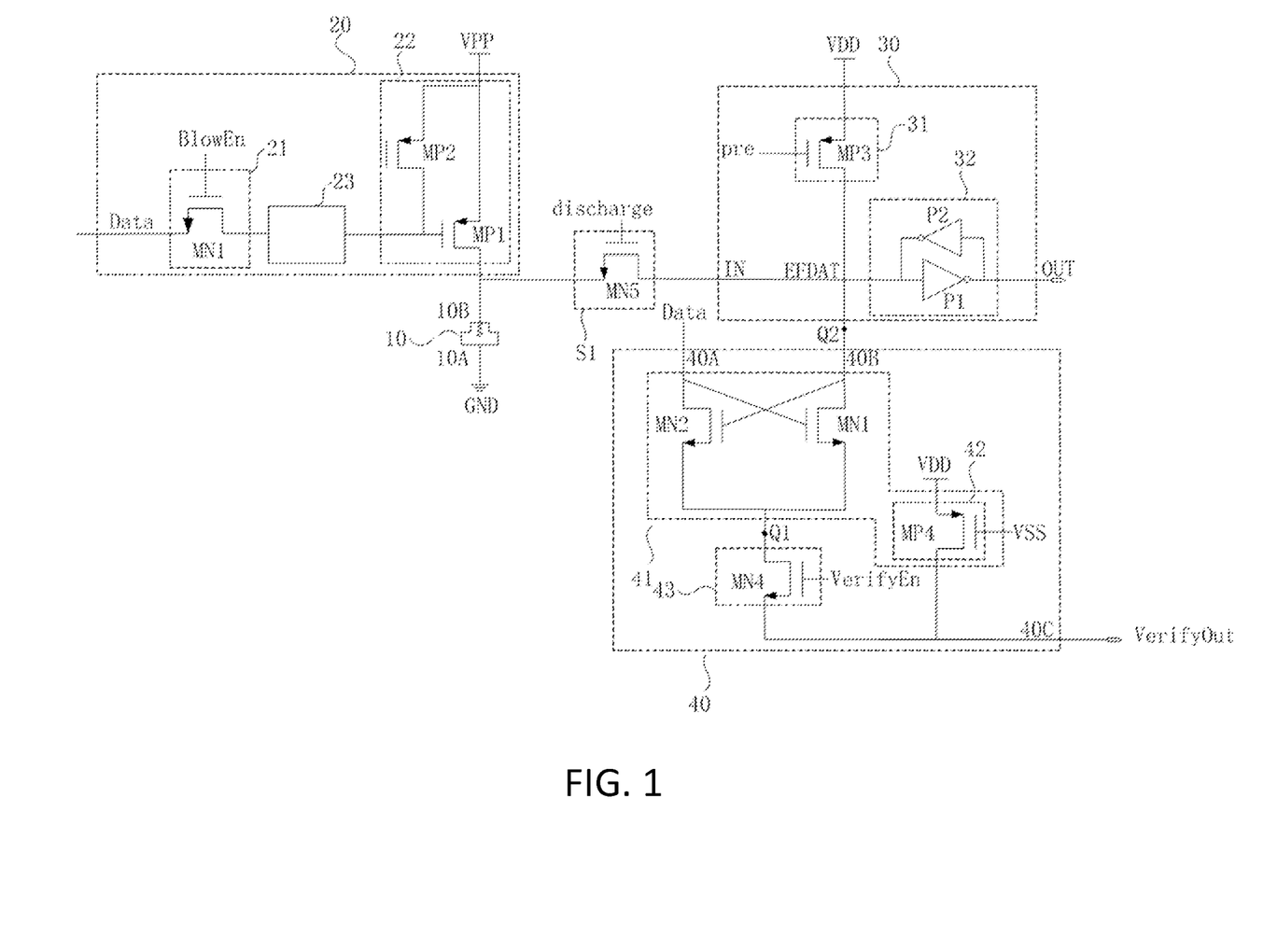
FIG. 1 is a schematic diagram of an anti-fuse circuit according to a first embodiment of the present disclosure.

FIG. 1 is a schematic diagram of an anti-fuse circuit according to the first embodiment of the present disclosure. Please refer to FIG. 1. The anti-fuse circuit includes an anti-fuse unit 10, a programming circuit 20 and a verification unit 40. The programming circuit 20 is used for programming the anti-fuse unit 10 according to the programming signal. The verification unit 40 includes a first input terminal 40A, a second input terminal 40B and a first output terminal 40C, the programming signal of the anti-fuse unit 10 is used as the input signal of the first input terminal 40A, and the anti-fuse unit 10 is used as the input signal of the first input terminal 40A. The data signal stored in the fuse unit 10 is used as the input signal of the second input terminal 40B, and the verification unit 40 can verify the programming state of the anti-fuse unit 10 according to the input signals of the first input terminal 40A and the second input terminal 40B, and the first output terminal 40C is used to output a verification signal VerifyOut. In this embodiment, the anti-fuse circuit further includes a writing and reading unit 30 for reading the data signal stored in the anti-fuse unit 10.

In this embodiment, the anti-fuse unit 10 includes a first terminal 10A and a second terminal 10B. The first terminal 10A is grounded to GND, and the second terminal 10B can be electrically connected to the input terminal IN of the reading unit 30, the second input terminal 40B of the verification unit 40 and the programming circuit 20, and connected to the second node Q2. A high voltage is applied between the first terminal 10A and the second terminal 10B of the anti-fuse unit 10, and the high voltage can break down the medium of the anti-fuse unit 10, so that the anti-fuse unit 10 changes from an insulating state to a conductive state, to realize the storage of information. After performing the programming operation on the anti-fuse unit 10, if the anti-fuse unit 10 is in a conducting state, it indicates that the anti-fuse unit 10 is broken down; if the anti-fuse unit 10 is in an insulating state, it indicates that the anti-fuse unit 10 is not broken down. In this embodiment, when the true value of the programming signal Data is "0", it indicates that the anti-fuse unit 10 is broken down, and when the true value of the programming signal Data is "1", it indicates that the anti-fuse unit 10 is not broken down.

In this embodiment, the programming circuit 20 is connected to the anti-fuse unit 10 for programming the anti-fuse unit 10 according to the programming control signal BlowEn, that is, the programming control signal BlowEn is the enabling signal of the programming circuit 20. When the anti-fuse unit 10 needs to be programmed, the programming control signal BlowEn enables the programming circuit 20 to perform a programming operation on the anti-fuse unit 10.

As an example, this embodiment also provides a structure of the programming circuit 20. The programming circuit 20 includes a programming control unit 21 and a signal converting unit 22.

The programming control unit 21 uses the programming control signal BlowEn as an enabling signal to transmit the programming signal Data to the signal conversion unit 22. For example, in this embodiment, the programming control unit includes a third NMOS transistor MN3, the control terminal of the third NMOS transistor MN3 is connected to the programming control signal BlowEn, and one terminal of the third NMOS transistor MN3 is connected to the programming control signal BlowEn. Write signal Data, the other end is connected to the signal conversion unit 22. When programming is required, the programming control signal BlowEn is set to a high level, so that the third NMOS transistor MN3 is turned on, and the programming signal Data is transmitted to the signal conversion unit 22.

One terminal of the signal conversion unit 22 is connected to the programming voltage VPP, and the other terminal is connected to the anti-fuse unit 10, and uses the programming signal Data as a control signal to realize programming of the anti-fuse unit 10. For example, in this embodiment, the signal conversion unit 22 includes a first PMOS transistor MP1 and a second PNOS transistor MP2, one terminal of the first PMOS transistor MP1 is connected to the programming voltage VPP, and the other terminal is connected to the anti-fuse unit 10 connected, the control terminal of the first PMOS transistor MP1 receives the programming signal Data. One terminal of the second PNOS transistor MP2 is connected to the programming voltage VPP, and the other terminal is connected to the control terminal of the first PMOS transistor MP1, and the control terminal of the second PNOS transistor MP2 receives a bias signal, wherein the bias voltage Vbias of the set signal is smaller than the programming voltage VPP.

When the anti-fuse unit 10 needs to be programmed, the programming signal Data is set to a low level, the programming control signal BlowEn is set to a high level, the third NMOS transistor MN3 is turned on, the programming signal Data controls the first PMOS transistor MP1 to be turned on, and the voltage difference between the two ends of the anti-fuse unit 10 is the voltage difference between the programming voltage VPP and the ground terminal GND, thereby realizing the anti-fuse unit 10 of writing. If the programming signal Data is set to a high level, the first PMOS transistor MP1 is not turned on, and the programming circuit 20 does not program the anti-fuse unit 10.

In this embodiment, the programming circuit 20 further includes an amplifying unit 23, and the programming signal Data output by the programming control unit 21 is transmitted to the signal conversion unit 22 after passing through the amplifying unit 23.

In the above example, the first terminal 10A of the anti-fuse unit 10 is grounded to GND, the second terminal 10B is connected to the input terminal IN of the reading unit 30, the second input terminal 40B of the verification unit 40 and the programming circuit 20 is connected to the second node Q2. It can be understood that, in some other examples, the first terminal of the anti-fuse unit 10 is connected to the programming voltage, and the second terminal is connected to the input terminal of the reading unit, the second input terminal of the verification unit and the programming circuit are connected to the second node Q2, and the programming circuit is connected to the ground terminal GND.

Please continue to refer to FIG. 1, the input terminal IN of the reading unit 30 is connected to the second terminal 10B of the anti-fuse unit 10, and the output terminal OUT of the reading unit 30 outputs a signal EFOUT. When the input terminal IN of the reading unit 30 is connected to the second terminal 10B of the anti-fuse unit 10, the input signal EFDAT at the input terminal of the reading unit 30 is affected by the data signal of the anti-fuse unit 10. Specifically, in this embodiment, if the anti-fuse unit 10 breaks down, the anti-fuse unit 10 is turned on, the second end 10B of the anti-fuse unit 10 is grounded, and the anti-fuse unit The data signal of the unit 10 is low level, then the input signal EFDAT of the input terminal of the reading unit 30 is pulled low and set to a low level; if the anti-fuse unit 10 is not broken down, the anti-fuse The unit 10 is not conducting, the second terminal 10B of the anti-fuse unit 10 is not grounded, and the data signal of the anti-fuse unit 10 is at a high level, then the input signal EFDAT at the input terminal of the reading unit 30 maintains Original level, such as maintaining high level.

As an example, this embodiment provides a circuit structure of the reading unit 30. The read unit 30 includes a pre-charge unit 31 and a latch 32.

The pre-charging unit 31 is used for pre-charging the second node Q2 according to the pre-charging control signal pre, that is, charging the input terminal IN of the reading unit 30.

In some embodiments, the pre-charging unit 31 includes a fifth transistor, the first terminal of the fifth transistor is electrically connected to the power supply voltage VDD, and the second terminal of the fifth transistor is electrically connected to the second node Q2. connected, the gate of the fifth transistor receives the precharge control signal pre. Specifically, in this embodiment, the fifth transistor is a POMS transistor. For example, as shown in FIG. 1, the fifth transistor is a third PMOS transistor MP3, and the first terminal of the third PMOS transistor MP3 It is connected to the power supply voltage VDD, the second terminal of the third PMOS transistor MP3 is connected to the second node Q2, and the gate of the third PMOS transistor MP3 receives the precharge control signal pre. When the pre-charge control signal pre is set to a low level, the third PMOS transistor MP3 is turned on, the second node Q2 is connected to the power supply voltage VDD, and the pre-charge unit 31 charges the second node Q2, pulling up the voltage of the second node Q2 (that is, the input terminal IN of the reading unit 30), so that the input signal EFDAT is set at a high level.

The input terminal of the latch 32 is electrically connected to the second node Q2 (ie, the input end IN of the reading unit 30), and the output end is electrically connected to the output end OUT of the reading unit 30. The latch 32 can hold the input signal EFDAT at the input terminal IN of the reading unit 30 by itself. In this embodiment, the latch includes a first inverter P1 and a second inverter P2, and the first inverter P1 and the second inverter P2 are connected end to end, wherein the first inverter P1 The input terminal of the first inverter P1 is electrically connected to the second node Q2, the output terminal of the first inverter P1 is electrically connected to the output end OUT of the reading unit 30, the input terminal of the second inverter P2 is electrically connected to the first The output terminal of the inverter P1 is electrically connected, and the output terminal of the second inverter P2 is electrically connected to the input terminal of the first inverter P1 to realize the function of a latch.

The verification unit 40 can verify the programming state of the anti-fuse unit 10 according to the input signals of the first input terminal 40A and the second input terminal 40B, and the first output terminal 40C is used to output a verification signal VerifyOut. The programming signal Data of the anti-fuse unit 10 is used as an input signal of the first input terminal 40A, and the data signal stored in the anti-fuse unit 10 is used as an input signal of the second input terminal 40B. In this embodiment, after the reading unit 30 is used to read the anti-fuse unit 10, the signal at the second node Q2 (that is, the input signal EFDAT at the input terminal IN of the reading unit 30) is equivalent to the Data signal for anti-fuse unit 10. So when entering the verification mode, the input signal of the second input terminal 40B of the verification unit is the signal of the second node Q2 (i.e., the input signal EFDAT of the input terminal IN of the reading unit 30).

In this embodiment, the verification unit 40 includes a logic gate circuit 41, and the logic gate circuit 41 is used to perform an OR logical operation or a NOR logical operation on the programming signal Data and the data signal of the anti-fuse unit 10 and output the operation result as the verification signal VerifyOut.

For example, the logic gate circuit 41 includes a first transistor, a second transistor and a charging unit. The first terminal of the first transistor is electrically connected to the second input terminal, the second terminal of the first transistor is electrically connected to the first node, the gate of the first transistor is electrically connected to the first input terminal electrical connection. The first terminal of the second transistor is electrically connected to the first input terminal, the second terminal of the second transistor is electrically connected to the first node, the gate of the second transistor is electrically connected to the second input terminal. The charging unit 42 is used for providing a logic state value of WEAK 1 to the first output terminal.

The first transistor and the second transistor are transistors of the same type, wherein, in this embodiment, both the first transistor and the second transistor are NMOS transistors, which implement an OR logic operation and store the operation result output as the verification signal VerifyOut.

Specifically, in this embodiment, the first transistor is a first NMOS transistor MN1, the first terminal of the first NMOS transistor MN1 is electrically connected to the second input terminal 40B, and the second terminal of the first NMOS transistor MN1 is electrically connected to the first node Q1, and the gate of the first NMOS transistor MN1 is electrically connected to the first input terminal 40A. The second transistor is a second NMOS transistor MN2, the first terminal of the second NMOS transistor MN2 is electrically connected to the first input terminal 40A, and the second terminal of the second NMOS transistor MN2 is electrically connected to the first input terminal 40A, the second NMOS transistor MN2 is electrically connected to the first node Q1, and the gate of the second NMOS transistor MN2 is electrically connected to the second input terminal 40B. The first node Q is electrically connected to the first output terminal 40C.

In other embodiments, both the first transistor and the second transistor are PMOS transistors, which implement a NOR logic operation, and output the operation result as the verification signal.

The charging unit 42 includes a third transistor and the third transistor is a PMOS transistor, the gate of the third transistor is grounded, the first terminal of the third transistor is connected to the power supply voltage VDD, and the second terminal of the third transistor is connected to the first output terminal 40C. Specifically, in this embodiment, the third transistor is a fourth PMOS transistor MP4, the first terminal of the fourth PMOS transistor MP4 is electrically connected to the power supply voltage VDD, and the second terminal of the fourth PMOS transistor MP4 terminal is electrically connected to the first output terminal 40C, the gate of the fourth PMOS transistor MP4 is grounded, and its voltage is VSS, then the fourth PMOS transistor MP4 is in a normally-on state, so that the first output terminal 40C has its default output remains at the supply voltage VDD. When one of the programming signal Data of the anti-fuse unit or the data signal stored in the anti-fuse unit 10 is at a low level, the output of the logic gate circuit 41 is at a low level, and the first output terminal 40C is pulled down, and the output signal changes from high level to low level.

In this embodiment, the verification unit 40 further includes a switch unit 43 connected between the first node Q1 and the first output terminal 40C, and the switch unit 43 is configured to respond to the verification enable signal VerifyEn to turn On or off to control the opening of the verification unit 40.

In some embodiments, the switch unit 43 includes a fourth transistor, the first terminal of the fourth transistor is electrically connected to the first node Q1, and the second terminal of the fourth transistor is connected to the first output Terminal 40C is electrically connected, and the gate of the fourth transistor receives the verification enable signal VerifyEn. Specifically, in this embodiment, the fourth transistor is a fourth NMOS transistor MN4. When entering the verification mode, when the verification enable signal VerifyEn is set to a high level, the fourth NMOS transistor MN4 is turned on, and the logic gate circuit 41 is electrically connected to the first output terminal 40C to realize the verification signal. When the verification mode is not entered, when the verification enable signal VerifyEn is set to low level, the fourth NMOS transistor MN4 is turned off, and the logic gate circuit 41 is not connected to the first output terminal 40C.

In this embodiment, the anti-fuse circuit further includes a read switch unit S1, the read switch unit S1 is used to control the input of the anti-fuse unit 10 according to the read enable signal input discharge and the read unit 30 is electrically connected to the input terminal IN. The second terminal 10B of the anti-fuse unit 10 is connected to the second node Q2 through the read switch unit S1, the input terminal IN of the read unit 20 and the second input terminal 40B of the verification unit 40.

In this embodiment, the read switch unit S1 is an NMOS transistor, for example, the read switch unit S1 is a fifth NMOS transistor MN5. When the read enable signal discharge is set to a high level, the fifth NMOS transistor MN5 is turned on, and the second terminal 10B of the anti-fuse unit 10 is connected to the read unit 20 through the fifth NMOS transistor MN5. The input IN and the second input 40B of the verification unit 40 are connected to the second node Q2. It can be understood that, when the programming circuit 20 programs the anti-fuse unit 10, the read enable signal discharge is set to a low level, the read switch unit S1 is turned off, and the anti-fuse unit 10 is not connected with the input terminal IN of the reading unit 30 and the verification unit 40.

Wherein, in this embodiment, the read switch unit S1 can also be used as a control switch of the read unit 30 to control the electrical connection between the read unit 30 and the anti-fuse unit 10 according to the read enable signal discharge. connect. When the read enable signal discharge is set to a high level, the fifth NMOS transistor MN5 is turned on, the input terminal IN of the read unit 30 is electrically connected to the anti-fuse unit 10, and the read unit 30 reads the data signal of the anti-fuse unit 10. It can be understood that when the programming circuit 20 programs the anti-fuse unit 10, the read enable signal discharge is set to a low level, the read switch unit S1 is turned off, and the read unit 30 The input terminal IN is not connected to the anti-fuse unit 10.

It should be noted that, in this embodiment, when performing read-write amplification on the anti-fuse unit 10, the read enable signal discharge is set to a low level, the read switch unit S1 is turned off, and the pre-charge unit 31 charges the input terminal IN of the reading unit 30 (that is, the second node Q2), so that the input terminal IN of the reading unit 30 is set to a high level; the read enable signal discharge is set to a high level, The read switch unit S1 is turned on, the input terminal IN of the read unit 30 is connected to the second terminal 10B of the anti-fuse unit 10, if the anti-fuse unit 10 breaks down, the input terminal IN of the read unit 30 becomes a low level, and the output terminal OUT outputs a high level. If the anti-fuse unit 10 is not broken down, the input terminal IN of the reading unit 30 maintains a high level, The output terminal OUT outputs low level.

In the anti-fuse circuit according to the embodiment of the present disclosure, when the anti-fuse unit 10 completes breakdown programming and enters the verify mode, the verification unit 40 can use the programming signal Data and the programming signal input from the first input terminal 40A. The data signal of the anti-fuse unit 10 input from the second input terminal 40B verifies in real time whether the programming of the anti-fuse unit is correct, thereby realizing the purpose of verifying the anti-fuse unit 10 in real time.

It can be understood that, in some embodiments, when the programming circuit 20 performs the programming operation and the reading unit 30 performs the read-write amplification operation, that is, when it is not in the verification mode, the verification unit 40 is not enabled.

Figure 2:
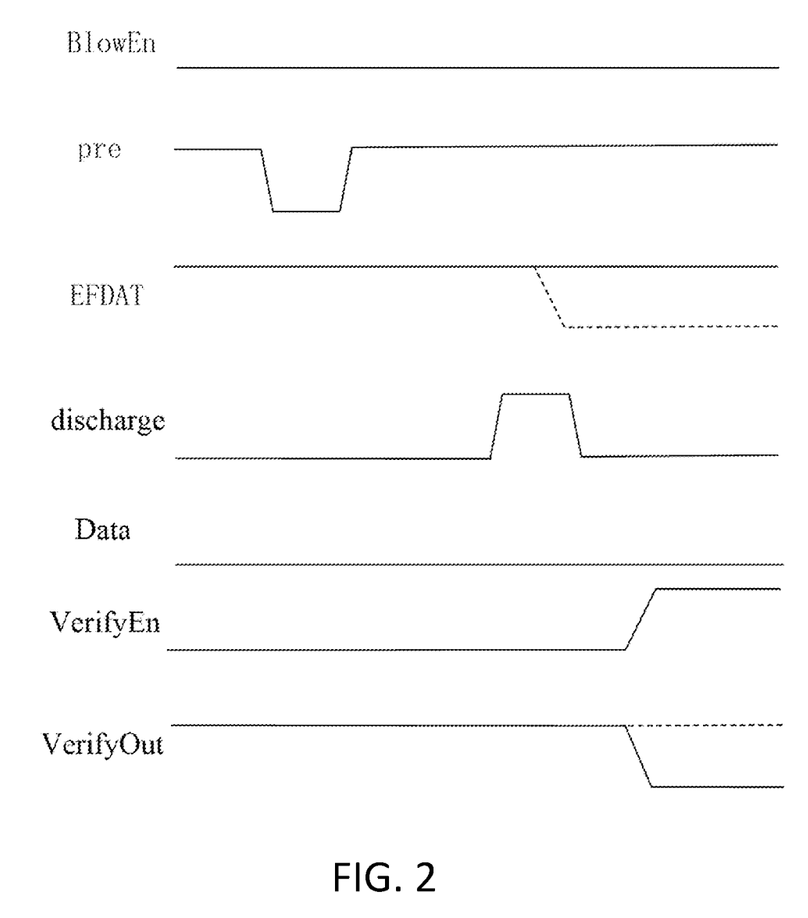
FIG. 2 is a signal timing diagram of the anti-fuse circuit according to the first embodiment of the present disclosure.

FIG. 2 is a signal timing diagram of the anti-fuse circuit according to the first embodiment of the present disclosure. Please refer to FIG. 2. After the anti-fuse unit 10 is broken down and programmed, the read enable signal discharge is set to a low level. The second node Q2 (that is, the input terminal IN of the reading unit 30) is not connected to the anti-fuse unit 10. In the pre-charging stage, the pre-charging control signal pre is set to a low level, the pre-charging unit 31 of the reading unit 30 charges the latch 32, and the input signal of the input terminal IN of the reading unit 30 EFDAT is asserted high. After the pre-charging is completed, the pre-charging control signal pre is set to a high level, the read enable signal discharge is set to a high level, and the second node Q2 (that is, the input terminal IN of the reading unit 30) connected to the anti-fuse unit 10 is turned on, and the reading unit 30 reads the data signal of the anti-fuse unit 10 to the input terminal IN. After the reading unit 30 reads the data signal of the anti-fuse unit 10 to the input terminal IN of the reading unit 10, the verification enable signal VerifyEn enables the verification unit 40. For example, in this embodiment, the verification enable signal VerifyEn is set to a high level, the switch unit 43 is turned on, and enters into a verification (verify) mode. In the verification mode, when the programming signal Data is at a low level (that is, the programming signal Data represents the breakdown of the anti-fuse unit 10), if the input signal EFDAT at the input terminal of the reading unit 30 maintains a high level (as shown by the solid line in FIG. 2), then the output signal VerifyOut of the first output terminal 40C of the verification unit 40 is low level (as shown by the solid line in FIG. 2), indicating that the real state of anti-fuse unit 10 is not broken down, the real state is inconsistent with the programming signal, and the programming error of the anti-fuse unit 10 is wrong; if the input signal EFDAT at the input terminal of the reading unit 30 becomes low, then the output signal VerifyOut of the first output terminal 40C of the verification unit 40 is high level (as shown by the dotted line in FIG. 2), indicating that the real state of the anti-fuse unit 10 is a breakdown signal, consistent with the programming signal, the anti-fuse unit 10 is programed correctly.

Figure 3:
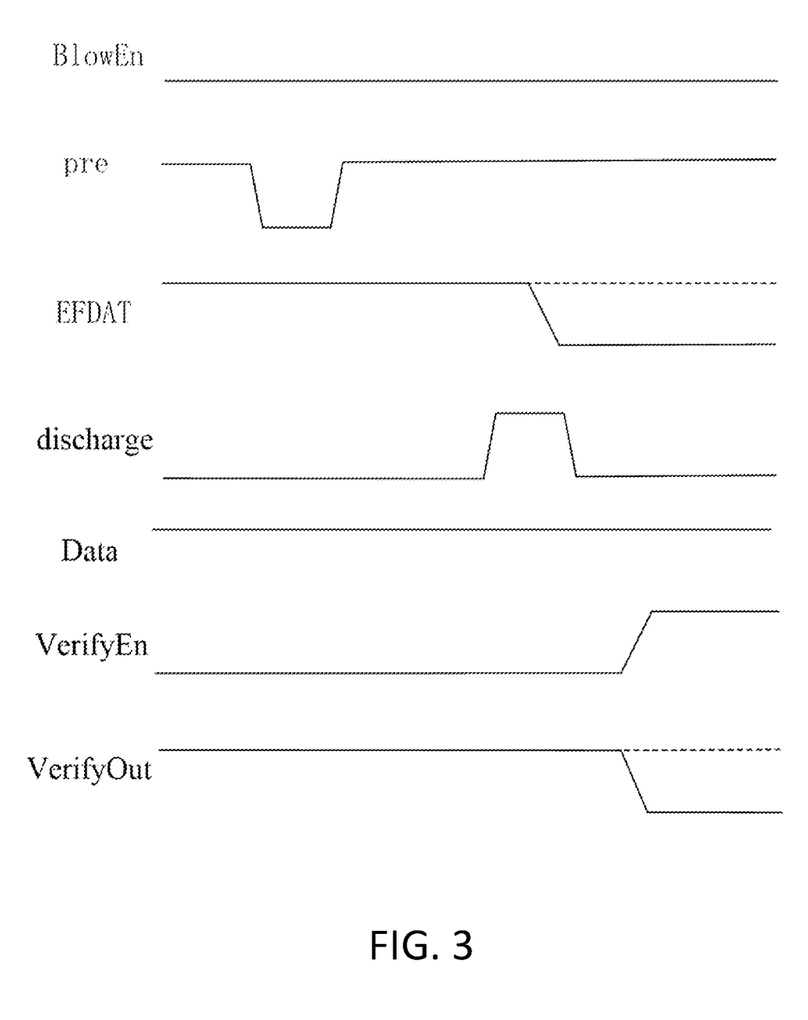
FIG. 3 is another signal timing diagram of the anti-fuse circuit according to the first embodiment of the present disclosure.

FIG. 3 is another signal timing diagram of the anti-fuse circuit according to the first embodiment of the present disclosure. Please refer to FIG. 3. In verification mode, when the programming signal Data is at a high level (that is, the programming signal Data indicates that the anti-fuse unit 10 is not broken down), if the input signal EFDAT at the input terminal of the reading unit 30 maintains a high level (as shown by the dotted line in FIG. 3), the first output terminal 40C of the verification unit 40 output signal VerifyOut is high level (as shown by the dotted line in FIG. 3), indicating that the real state of the anti-fuse unit 10 is not broken down, which is consistent with the programming signal, and the state the anti-fuse unit 10 is programmed correctly; if the input signal EFDAT of the input terminal of the reading unit 30 becomes low level (as shown by the solid line in FIG. 3), the output signal VerifyOut of the first output terminal 40C of the verification unit 40 is low level (As shown by the solid line in FIG. 3), it shows that the real state of the anti-fuse unit 10 is breakdown, which is inconsistent with the programming signal, and the anti-fuse unit 10 is wrongly programmed.

It can be seen that the anti-fuse circuit of the present disclosure does not need to read the data signal of the anti-fuse unit 10 to the test machine and then verify the programming state of the anti-fuse unit 10, but can verify the anti-fuse unit 10 in real time, according to the embodiment of the present disclosure, the anti-fuse unit 10 can quickly verify the programming status of the anti-fuse unit 10, so to save time, and have high verification accuracy.

Figure 4:
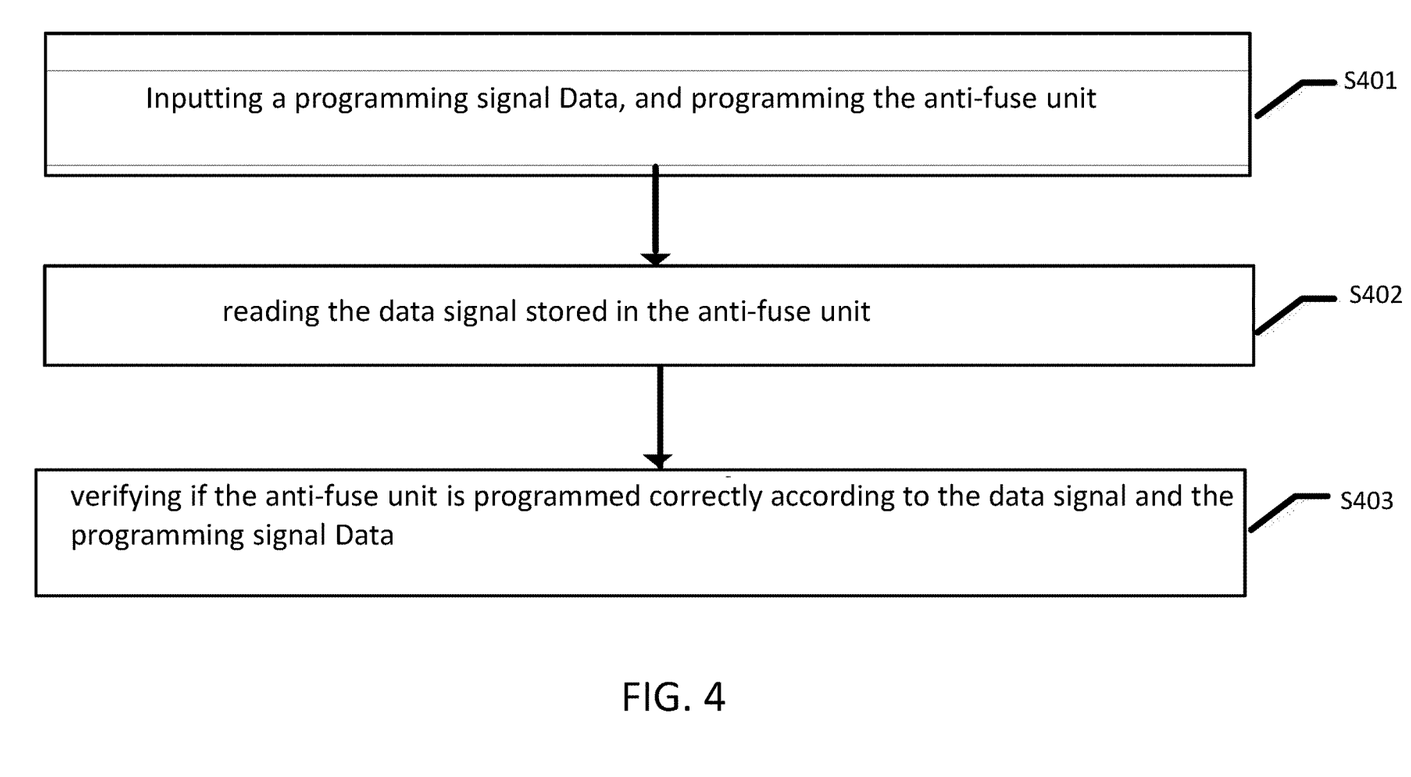
FIG. 4 shows a schematic diagram of the steps of the real-time verification method for the programming state of the anti-fuse unit according to the second embodiment of the present disclosure.

An embodiment of the present disclosure also provides a real-time verification method for the programming state of the anti-fuse unit, and the verification method adopts the above-mentioned anti-fuse circuit. FIG. 4 is a schematic diagram of the steps of the real-time verification method for the programming status of the anti-fuse unit according to the second embodiment of the present disclosure. Please refer to FIGS. 1 and 4. The method includes:

Step S401, inputting a programming signal Data, and programming the anti-fuse unit 10 according to the programming signal Data.

Specifically, in this embodiment, the programming control signal BlowEn enables the programming unit 20 of the anti-fuse circuit, so that the programming circuit can determine whether to execute the program on the anti-fuse unit 10 to perform write operation according to the programming signal Data. For example, in this embodiment, the programming signal Data is input by the programming control unit 21 as the control signal of the signal conversion unit 22, if the programming signal Data represents the anti-fuse unit 10. If there is no breakdown, the programming signal Data is at high level, and if the programming signal Data indicates that the anti-fuse unit 10 is broken down, then the programming signal Data is at low level.

Step S402, reading the data signal stored in the anti-fuse unit 10.

In this embodiment, the reading unit 30 is used to read the data signal stored in the anti-fuse unit 10, and before the reading unit 30 reads the data signal stored in the anti-fuse unit 10, the method further includes a step of pre-charging the reading unit 30.

After the anti-fuse unit 10 completes the breakdown programming, the read enable signal discharge is set to a low level, the input terminal IN of the reading unit 30 is disconnected from the anti-fuse unit 10, and enters the pre-charging stage. The pre-charge control signal is set to low level, the pre-charge unit 31 of the reading unit 30 charges the latch 32, and the input signal EFDAT of the input terminal IN of the reading unit 30 is set to high level. After the pre-charging is completed, the pre-charging control signal pre is set to a high level, the enable signal discharge is set to a high level, the input terminal IN of the reading unit 30 is connected to the anti-fuse unit 10, and the read unit 30 reads the data signal stored in the anti-fuse unit 10 to the input terminal IN.

In this embodiment, after reading the data signal stored in the anti-fuse unit 10, the following step further includes: cutting off the electrical connection between the anti-fuse unit 10 and the verification unit 40. For example, the read enable signal discharge is set to a low level, and the read switch unit S1 is turned off, so as to cut off the electrical connection with the anti-fuse unit 10 and the input terminal of the verification unit 40 and the input terminal of the read unit 30 (that is the second node Q2).

Step S403, verifying whether the programming of the anti-fuse unit 10 is correct according to the data signal and the programming signal Data.

In this step, the anti-fuse circuit uses the verification unit 40 to verify whether the programming of the anti-fuse unit 10 is correct. The programming signal Data of the anti-fuse unit 10 is used as the input signal of the first input terminal 40A of the verification unit 40, and the data signal stored in the anti-fuse unit 10 is used as the input signal of the verification unit 40. The input signal of the second input terminal 40B, the verification unit 40 verifies whether the programming of the anti-fuse unit 10 is correct according to the input signals of the first input terminal 40A and the second input terminal 40B, and the first output terminal 40C is used to output the verification signal VerifyOut.

In this embodiment, verifying whether the anti-fuse unit is correctly programmed according to the data signal and the programming signal includes: if the programming signal of the anti-fuse unit is consistent with the data of the anti-fuse unit If the signals are consistent, the programming of the anti-fuse unit is correct. If the programming signal of the anti-fuse unit is inconsistent with the data signal of the anti-fuse unit, the programming of the anti-fuse unit is wrong.

For example, in one embodiment, after the reading unit 30 reads the data signal of the anti-fuse unit 10 to the input terminal IN of the reading unit 10, the verification enable signal VerifyEn enables the verification unit 40, for example, in this embodiment, the verify enable signal VerifyEn is set to a high level, the switch unit 43 is turned on, and enters into a verify (verify) mode. Please refer to FIG. 5, which is a signal truth table. In the verification mode, when the programming signal Data is at a high level (that is, the programming signal Data indicates that the anti-fuse unit 10 is not broken down), its true value is "1", if the input signal EFDAT at the input terminal of the reading unit 30 (equivalent to the data signal stored in the anti-fuse unit 10) maintains a high level, and its true value is "1", the verification unit 40 outputs a verification signal VerifyOut by the first output terminal 40C which is a high level, and its true value is "1", indicating that the real state of the anti-fuse unit 10 is not broken down, and the real state is consistent with the programming signal. The programming state of the anti-fuse unit 10 is not broken down, and the anti-fuse programming is correct; if the input signal EFDAT at the input terminal of the reading unit 30 (equivalent to the data signal stored in the anti-fuse unit 10) becomes low Level, its true value is "0", then the verification signal VerifyOut output by the first output terminal 40C of the verification unit 40 is low level, its true value is "0", indicating the true state of the anti-fuse unit 10 It is a breakdown, the real state is inconsistent with the programming signal, the programming state of the anti-fuse unit 10 is false breakdown, and the anti-fuse is incorrectly programmed.

Figure 5:
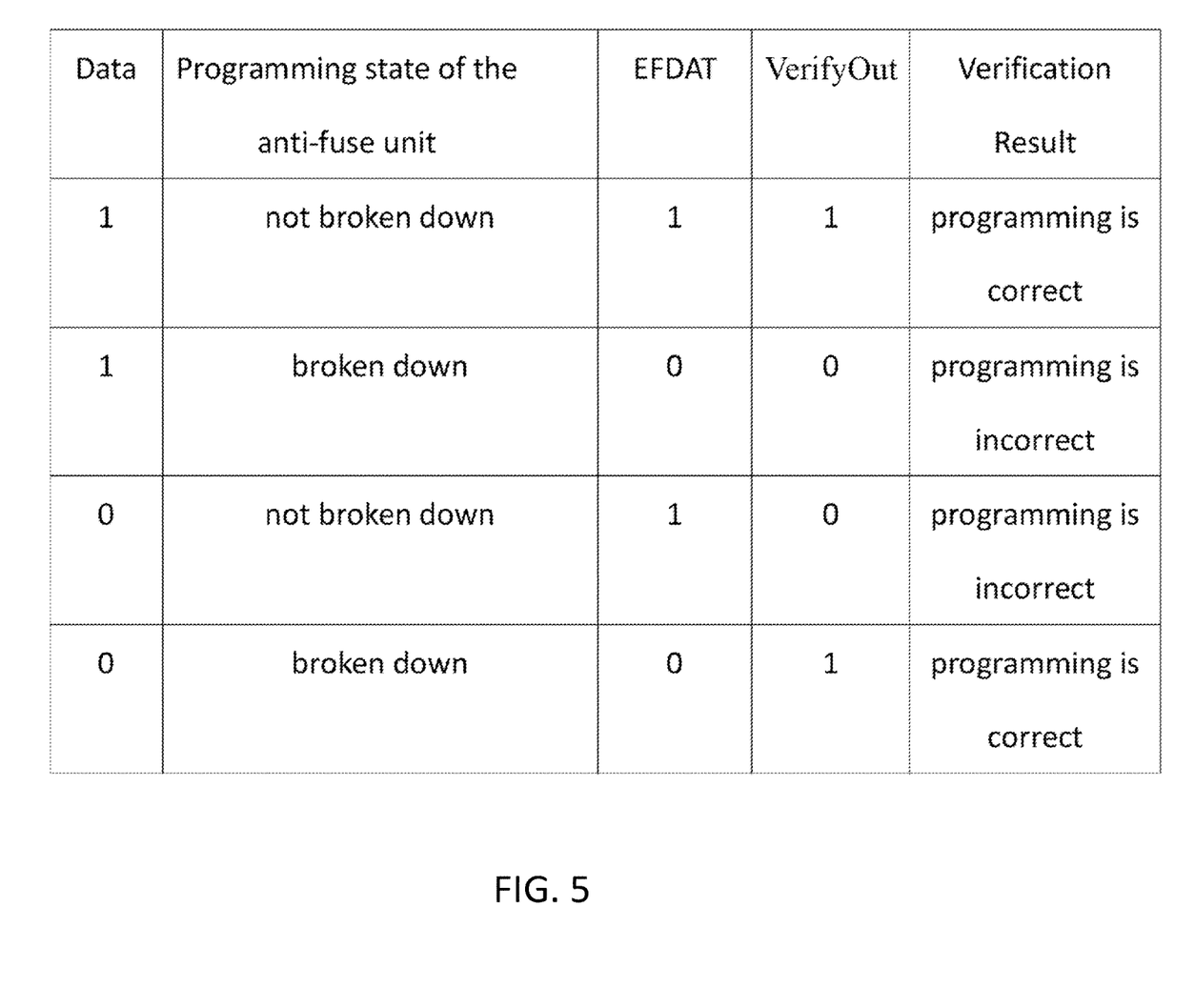
FIG. 5 is the true signal value table.

For another example, in one embodiment, in the verification mode, when the programming signal Data is at a low level (that is, the programming signal Data represents the breakdown of the anti-fuse unit 10), its true value is "0", if the input signal EFDAT (equivalent to the data signal stored in the anti-fuse unit 10) at the input terminal of the reading unit 30 maintains a high level and its true value is "1", then the first output terminal of the verification unit 40 The verification signal VerifyOut output by 40C is low level, and its true value is "0", indicating that the real state of the anti-fuse unit 10 is not broken down, and the real state is inconsistent with the programming signal. programming error; if the input signal EFDAT (equivalent to the data signal stored in the anti-fuse unit 10) at the input of the reading unit 30 becomes low level and its true value is "0", then the verifying unit 40 The verification signal VerifyOut output by an output terminal 40C is a high level, and its true value is "1", indicating that the real state of the anti-fuse unit 10 is a breakdown, and the real state is consistent with the programming signal. The programming of the anti-fuse unit 10 is correct.

The real-time verification method of the programming state of the anti-fuse unit according to the embodiment of the present disclosure can quickly verify the programming of the anti-fuse unit 10 in real time according to the data signal stored in the anti-fuse unit 10 and the programming signal Data state, there is no need to read the data signal of the anti-fuse unit 10 to the test machine and then verify the programming state of the anti-fuse unit 10, which saves time and has high verification accuracy.

The above is only a preferred embodiment of the present invention, it should be pointed out that for those of ordinary skill in the art, without departing from the principle of the present invention, some improvements and modifications can also be made, and these improvements and modifications should also be considered within the protection scope of the present invention.

The invention claimed is:
1. An anti-fuse circuit comprising:
an anti-fuse unit;
a programming circuit, wherein the programming circuit is configured to program the anti-fuse unit according to a programming signal; and
a verification unit, wherein the verification unit comprises a first input terminal, a second input terminal and a first output terminal, wherein the programming signal of the anti-fuse unit is used as an input signal of the first input terminal, and wherein a data signal stored in the anti-fuse unit is used as an input signal of the second input terminal, wherein the verification unit verifies a programming state of the anti-fuse unit according to the input signal of the first input terminal and the input signal of the second input terminal, and the first output terminal is used to output a verify signal.

2. The anti-fuse circuit according to claim 1, wherein the verification unit comprises a logic gate circuit, wherein the logic gate circuit performs an OR logical operation or a NOR logical operation on the programming signal and the data signal, and outputs an operation result as a verification signal.

3. The anti-fuse circuit according to claim 2, wherein the logic gate circuit comprises:
a first transistor, wherein a first terminal of the first transistor is electrically connected to a second input terminal of the verification unit, wherein the second terminal of the first transistor is electrically connected to a first node, wherein a gate of the first transistor is electrically connected to the first input terminal of the verification unit;
a second transistor, wherein a first terminal of the second transistor is electrically connected to the first input terminal of the verification unit, wherein a second terminal of the second transistor is electrically connected to the first node, wherein a gate of the second transistor is electrically connected to the second input terminal of the verification unit, and the first node is electrically connected to the first output terminal of the verification unit; and a charging unit, wherein the charging unit is configured to provide a logic state value of WEAK 1 to the first output terminal.

4. The anti-fuse circuit according to claim 3, wherein the first transistor and the second transistor are of a same type.

5. The anti-fuse circuit according to claim 4, wherein both the first transistor and the second transistor are NMOS transistors or PNOS transistors.

6. The anti-fuse circuit according to claim 3, wherein the charging unit comprises a third transistor, wherein the third transistor is a PMOS transistor, wherein a gate of the third transistor is grounded, wherein a first terminal of the third transistor is connected to a power supply voltage, and a second terminal of the third transistor is connected to the first output terminal of the verification unit.

7. The anti-fuse circuit according to claim 3, wherein the logic gate circuit further comprises a switch unit connected between the first node and the first output terminal, of the verification unit, wherein the switch responds to a verification enable signal to turn on or off.

8. The anti-fuse circuit according to claim 7, wherein the switch unit comprises a fourth transistor, wherein a first terminal of the fourth transistor is electrically connected to the first node, wherein a second terminal of the fourth transistor is is electrically connected to the first output terminal, and wherein a gate of the fourth transistor receives the verification enable signal.

9. The anti-fuse circuit according to claim 8, wherein the fourth transistor is an NMOS transistor.

10. The anti-fuse circuit according to claim 1, further comprising a read unit for reading the data signal of the anti-fuse unit.

11. The anti-fuse circuit according to claim 10, further comprising a read switch unit configured to control an input terminal of the anti-fuse unit and according to a read enable signal, and electrically connect to an input terminal of the read unit.

12. The anti-fuse circuit according to claim 11, wherein the anti-fuse unit further comprises a first terminal and a second terminal, wherein the first terminal of the anti-fuse unit is grounded, and the second terminal of the anti-fuse unit is connected to a second node through the read switch unit, the input terminal of the read unit, and the second input terminal of the verification unit.

13. The anti-fuse circuit according to claim 12, wherein the read unit further comprises:
a pre-charging unit, wherein the pre-charging unit is configured to pre-charge the second node according to a pre-charging control signal;
a latch, wherein an input terminal of the latch is electrically connected to the second node, and wherein an output terminal of the latch is configured to be an output terminal of the read unit.

14. The anti-fuse circuit according to claim 13, wherein the pre-charging unit comprises a fifth transistor, wherein a first terminal of the fifth transistor is electrically connected to a power supply voltage, wherein a second terminal of the fifth transistor is electrically connected to the second node, and wherein a gate of the fifth transistor receives the pre-charge control signal.

15. A real-time verification method for verifying the programming state of the anti-fuse unit of the anti-fuse circuit according to claim 1, wherein the method comprises:
inputting a programming signal, and programming the anti-fuse unit according to the programming signal;
reading the data signal stored in the anti-fuse unit; and
verifying if the programming of the anti-fuse unit is correct according to the data signal and the programming signal.

16. The real-time verification method for verifying the programming state of the anti-fuse unit of the anti-fuse circuit according to claim 15, wherein, verifying if the programming of the anti-fuse unit is correct according to the data signal and the programming signal, comprises:
if the programming signal of the anti-fuse unit is consistent with the data signal of the anti-fuse unit, then the programming of the anti-fuse unit is correct; and
if the programming signal of the anti-fuse unit is consistent with the data signal of the anti-fuse unit are inconsistent, then the programming of the anti-fuse unit is incorrect.

* * * * *